United States Patent
Sung et al.

(10) Patent No.: US 10,403,552 B1
(45) Date of Patent: Sep. 3, 2019

(54) REPLACEMENT GATE FORMATION WITH ANGLED ETCH AND DEPOSITION

(71) Applicant: Varian Semiconductor Equipment Associates, Inc., Gloucester, MA (US)

(72) Inventors: Min Gyu Sung, Essex, MA (US); Naushad K. Variam, Marblehead, MA (US); Sony Varghese, Manchester, MA (US); Johannes Van Meer, Middleton, MA (US); Jae Young Lee, Bedford, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 0 days.

(21) Appl. No.: 15/943,280

(22) Filed: Apr. 2, 2018

(51) Int. Cl.
| C23C 14/22 | (2006.01) |
| H01L 29/66 | (2006.01) |
| H01L 29/78 | (2006.01) |
| H01L 21/311 | (2006.01) |
| H01L 21/3213 | (2006.01) |
| H01L 21/8238 | (2006.01) |

(52) U.S. Cl.
CPC .... *H01L 21/823842* (2013.01); *C23C 14/221* (2013.01); *H01L 21/31116* (2013.01); *H01L 21/3213* (2013.01); *H01L 29/66545* (2013.01); *H01L 29/66795* (2013.01); *H01L 29/785* (2013.01)

(58) Field of Classification Search
CPC ............... H01L 21/823842; C23C 14/221
See application file for complete search history.

(56) References Cited

U.S. PATENT DOCUMENTS

| 2012/0175711 A1* | 7/2012 | Ramachandran ........................... H01L 21/76897 257/383 |
| 2012/0217590 A1* | 8/2012 | Babich .............. H01L 21/28088 257/410 |
| 2015/0380305 A1* | 12/2015 | Basker .............. H01L 21/76846 257/77 |

\* cited by examiner

*Primary Examiner* — Farun Lu (57) ABSTRACT

Methods herein may include forming trenches in a stack of layers atop a substrate, and forming a gate dielectric within the trenches. Methods may further include forming a first work function (WF) metal atop the gate dielectric, and forming a capping layer over the first WF metal using an angled ion implant deposition, the capping layer extending across the trenches. The first WF metal may be removed from just a first trench of the trenches, and a second WF metal is then formed over the stack of layers, wherein the second WF metal is formed atop the gate dielectric within the first trench. An angled ion etch may then be performed to recess the gate dielectric and the second WF metal within the first trench, and to recess the gate dielectric and the first WF metal within a second trench. A gate metal may then be formed within the trenches.

20 Claims, 10 Drawing Sheets

REPLACEMENT GATE FORMATION WITH ANGLED ETCH AND DEPOSITION

FIELD OF THE DISCLOSURE

The present embodiments relate to substrate patterning, and more particularly, to techniques for metal replacement gate formation using a deposition by angled ion implant and an angled ion etch.

BACKGROUND OF THE DISCLOSURE

The drive for high performance involves high speed operation of microelectronic components having high drive currents in addition to low leakage, i.e., low off-state current, to reduce power consumption. The structural and doping parameters tending to provide an increase in drive current adversely impact leakage current.

Gate last metal gate, also called replacement gate, techniques have been developed to address problems attendant upon substituting metal gate electrodes for polysilicon gate electrodes. For example, an amorphous silicon (a-Si) or polysilicon gate is used during initial processing until high temperature annealing to activate source/drain implants has been implemented. Subsequently, the a-Si or polysilicon is removed and replaced with a metal gate.

A number of issues are present with replacement metal gates.

For example, during work function metal formation, the N-type field effect transistor (NFET) is filled by an organic planarization layer (OPL) and etched away by a patterning process. During the OPL etch process, the long channel of the transistor is opened earlier than the short channel due to a reactive ion etch (ME) loading effect. In such cases, the ME causes damage on the long channel, thus leading to transistor performance degradation.

Another problem with replacement metal gate formation results from the combined work function metal in NFET (NFET work function first) or PFET (PFET work function first) in the short channel. Because there has to be a smaller space, or no space, to fill by gate W metal in one polarity, larger gate line resistance results.

Furthermore, conventional work function chamfering processes, such as performing an OPL coating followed by lithography to cover long channel, as well as a partial OPL recess on the short channel followed by an OPL strip, involves an additional lithography process to protect long channel work function metal. The additional lithography process increases processing steps and therefore cost.

SUMMARY OF THE DISCLOSURE

In view of the foregoing, what is needed are methods for forming a metal replacement gate using a deposition by angled ion implant and an angled ion etch. In one approach, a method includes forming a set of trenches in a stack of layers, the stack of layers positioned atop a substrate, forming a gate dielectric within the set of trenches, and forming a first work function (WF) metal atop the gate dielectric within the set of trenches. The method may further include forming a capping layer over the first WF metal using an angled ion implant deposition, the capping layer extending across the set of trenches. The method may further include removing the first WF metal from just a first trench of the set of trenches, and forming a second WF metal over the stack of layers, wherein the second WF metal is formed atop the gate dielectric within the first trench. The method may further include performing an angled ion etch to the set of trenches, wherein the angled ion etch recesses the gate dielectric and the second WF metal within the first trench of the set of trenches, and recesses the gate dielectric and the first WF metal within a second trench of the set of trenches. The method may further include forming a gate metal within the set of trenches.

In another approach, a method of forming replacement metal gate includes forming a set of trenches in an interlayer dielectric selective to a top surface of a substrate, forming a gate dielectric within the set of trenches, and forming a first work function (WF) metal atop the gate dielectric within the set of trenches. The method may further include forming a capping layer over the first WF metal using an angled ion implant deposition, wherein the capping layer extends across the set of trenches. The deposition by angled ion implant to form the capping layer may be is delivered at a non-perpendicular angle relative to a top surface of the interlayer dielectric. The method may further include removing the first WF metal from just a first trench of the set of trenches, and forming a second WF metal over the stack of layers, wherein the second WF metal is formed atop the gate dielectric within the first trench. The method may further include performing an angled ion etch to the set of trenches, wherein the angled ion etch recesses the gate dielectric and the second WF metal within the first trench of the set of trenches. The angled etch further recesses the gate dielectric and the first WF metal within a second trench of the set of trenches. The method may further include forming a gate metal within the set of trenches.

In yet another approach, a method of forming replacement metal gates includes providing a device, the device having an interlayer dielectric atop a substrate, and a gate dielectric within a set of trenches formed in the interlayer dielectric. The device may further include a first work function (WF) metal atop the gate dielectric within the set of trenches. The method may further include forming a capping layer over the first WF metal using an angled ion implant deposition, wherein the capping layer extends across the set of trenches, and wherein the angled ion implant is delivered at a non-perpendicular angle relative to a top surface of the interlayer dielectric. The method may further include removing the first WF metal from just a first trench of the set of trenches, and forming a second WF metal over the interlayer dielectric, wherein the second WF metal is formed atop the gate dielectric within the first trench. The method may further include performing an angled ion etch to the set of trenches, wherein the angled ion etch is performed at a non-perpendicular angle relative to the top surface of the interlayer dielectric. The angled ion etch recesses the gate dielectric and the second WF metal within the first trench of the set of trenches, and recesses the gate dielectric and the first WF metal within a second trench of the set of trenches.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods in accordance with the present disclosure will now be described more fully hereinafter with reference to the accompanying drawings, where embodiments of the methods are shown. The method may be embodied in many different forms and are not to be construed as being limited to the embodiments set forth herein. Instead, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of skill. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

Figure 1A:
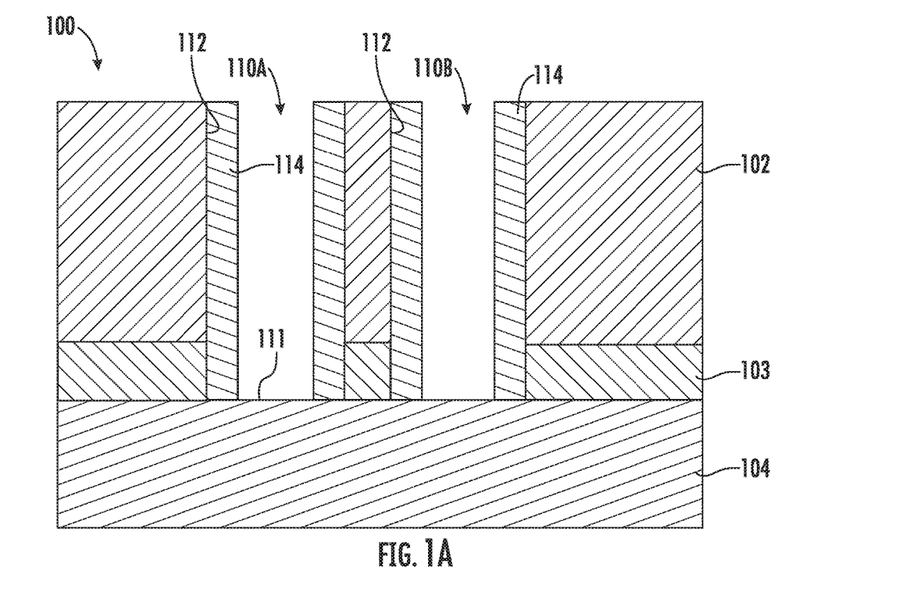
FIG. 1A depicts a side cross-sectional view of forming a set of trenches in a short channel of a device in accordance with embodiments of the present disclosure.
Figure 1B:
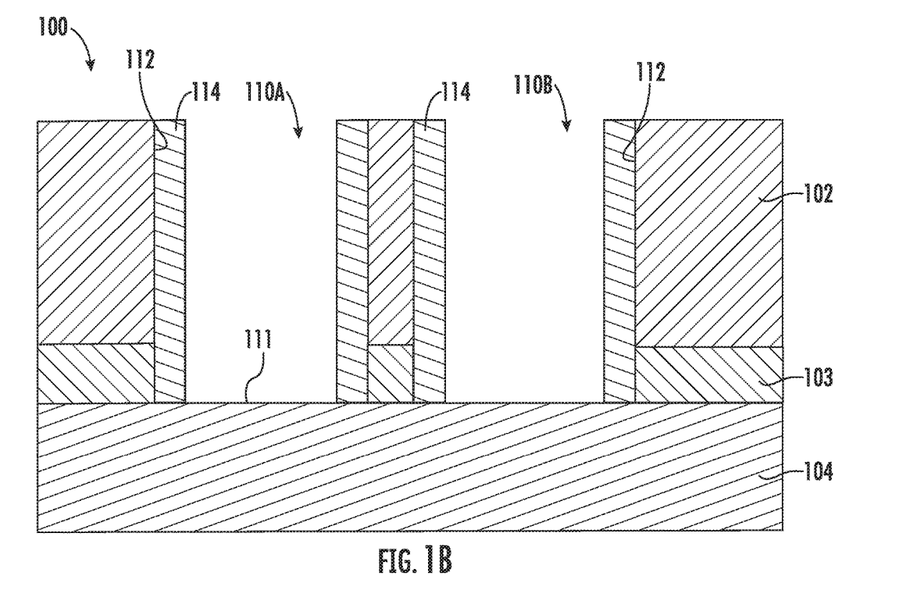
FIG. 1B depicts a side cross-sectional view of forming a set of trenches in a long channel of a device in accordance with embodiments of the present disclosure.

Turning now to FIGS. 1A-B, there are shown cross-sectional views of a device 100 (e.g., a finFET semiconductor device) according to embodiments of the disclosure. FIG. 1A depicts a short channel of the device 100, while FIG. 1B depicts a long channel of the device 100. The device 100 includes a stack of layers including an interlayer dielectric (ILD) 102 and source drain regions 103 formed by epitaxial (EPI) growth. The stack of layers 102, 103 may be formed on a substrate 104 (e.g., bulk silicon). First and second trenches 110A-B may be formed in the ILD 102, selective to a top surface 111 of the substrate 104. Although not shown for the sake of brevity, the trenches 110A-B may be formed by a dummy gate polysilicon removal process. Furthermore, the first trench 110A may correspond to an NFET, and the second trench may correspond to a PFET.

Along a sidewall 112 of each of the trenches 110A-B may be a gate spacer 114. The gate spacer 114 can be formed by depositing a blanket layer of dielectric material and then planarizing the dielectric material via chemical mechanical planarization (CMP) to recess the top of the gate spacer to approximately the same height as the ILD 102. The gate spacer 114 provides electrical isolation between adjacent gate segments and with respect to the fins outside the gate.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present embodiments. For example, the semiconductor substrate may comprise a semiconductor wafer (e.g., silicon, SiGe, or an SOI wafer) or one or more die on a wafer, and any epitaxial layers or other type semiconductor layers formed there over or associated therewith. A portion or entire semiconductor substrate may be amorphous, polycrystalline, or single-crystalline. In addition to the aforementioned types of substrates, the semiconductor substrate employed in the present embodiments may also comprise a hybrid oriented (HOT) semiconductor substrate having surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

As used herein, the term "depositing" may include any now known or later developed techniques appropriate for the material to be deposited. For example, depositing may include: chemical vapor deposition (CVD), low-pressure CVD (LPCVD), plasma-enhanced CVD (PECVD), semi-atmosphere CVD (SACVD) and high density plasma CVD (HDPCVD). Depositing may further include: rapid thermal CVD (RTCVD), ultra-high vacuum CVD (UHVCVD), limited reaction processing CVD (LRPCVD), metal-organic CVD (MOCVD), sputtering deposition, and ion beam deposition. Depositing may further include: electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Figure 2A:
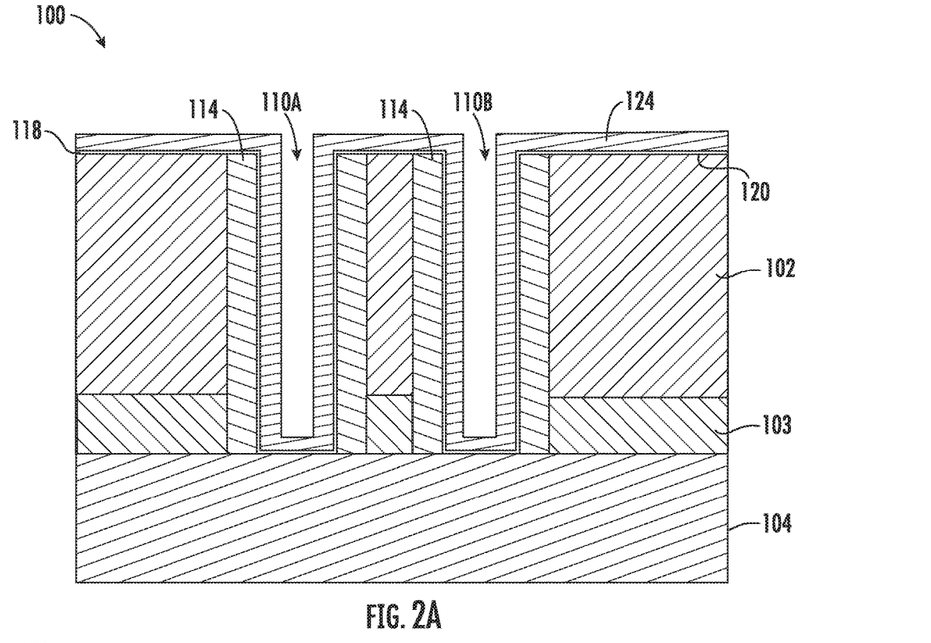
FIG. 2A depicts a side cross-sectional view of a gate dielectric and a first work function metal formed over the short channel of the device in accordance with embodiments of the present disclosure.
Figure 2B:
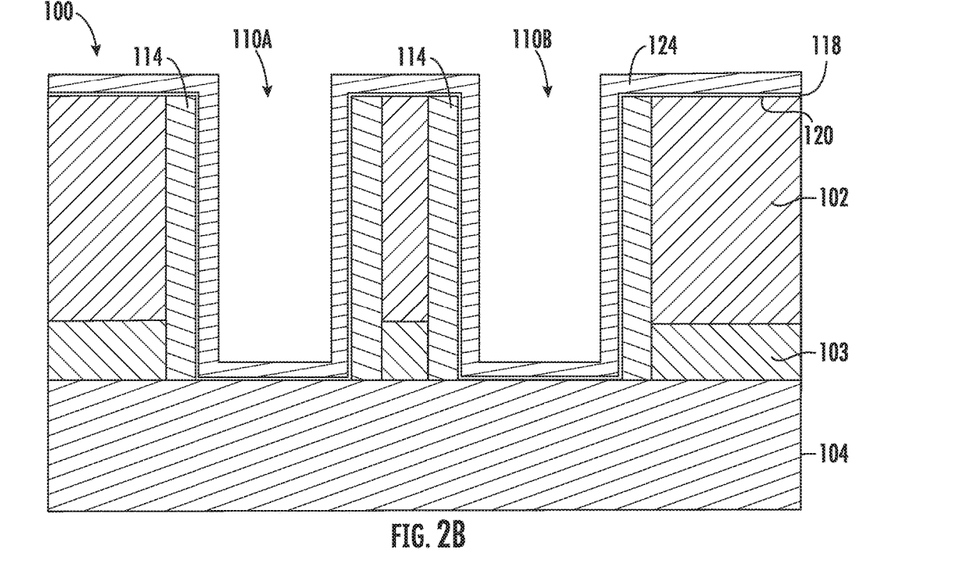
FIG. 2B depicts a side cross-sectional view of forming the gate dielectric and the first work function metal formed over the long channel of the device in accordance with embodiments of the present disclosure.

Turning now to FIGS. 2A-B, a gate dielectric 118 may be formed atop the stack of layers 102 and 103, including within each of the trenches 110A-B. As shown, FIG. 2A depicts the short channel of the device 100, while FIG. 2B depicts a long channel of the device 100. The gate dielectric 118 may be conformally deposited along the gate spacers and over a top surface 120 of the ILD 102. The gate dielectric 118 may include silicon oxide, silicon nitride, a high-k dielectric, or other suitable material. A high-k dielectric may include a binary or ternary compound such as hafnium oxide. Further exemplary high-k dielectrics include, yet are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x is independently from 0.5 to 3 and each value of y is independently from 0 to 2. The gate dielectric 118 may be deposited by a suitable process such as atomic layer deposition (ALD), chemical vapor deposition (CVD), physical vapor deposition (PVD), thermal oxidation, UV-ozone oxidation, or combinations thereof. The gate dielectric 118 may range from 1 nm to 10 nm.

A first work function (WF) metal 124 may then be formed over the gate dielectric 118. The first WF metal 124 may be a p-type WF metal, such as TiN, conformally deposited atop the gate dielectric 118, including within each of the trenches 110A-B.

Figure 3A:
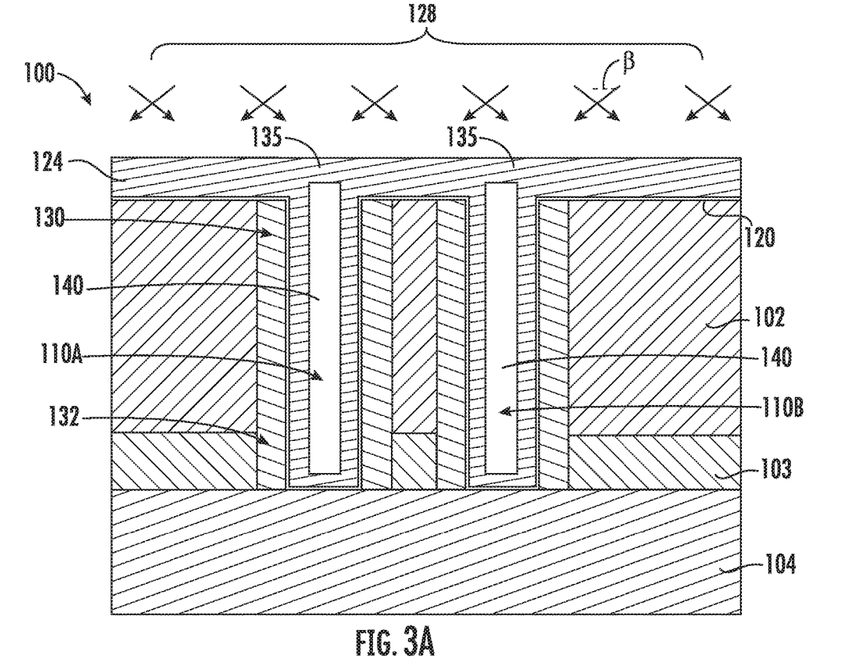
FIG. 3A depicts a side cross-sectional view of the deposition by angled ion implant to the short channel of the device in accordance with embodiments of the present disclosure.
Figure 3B:
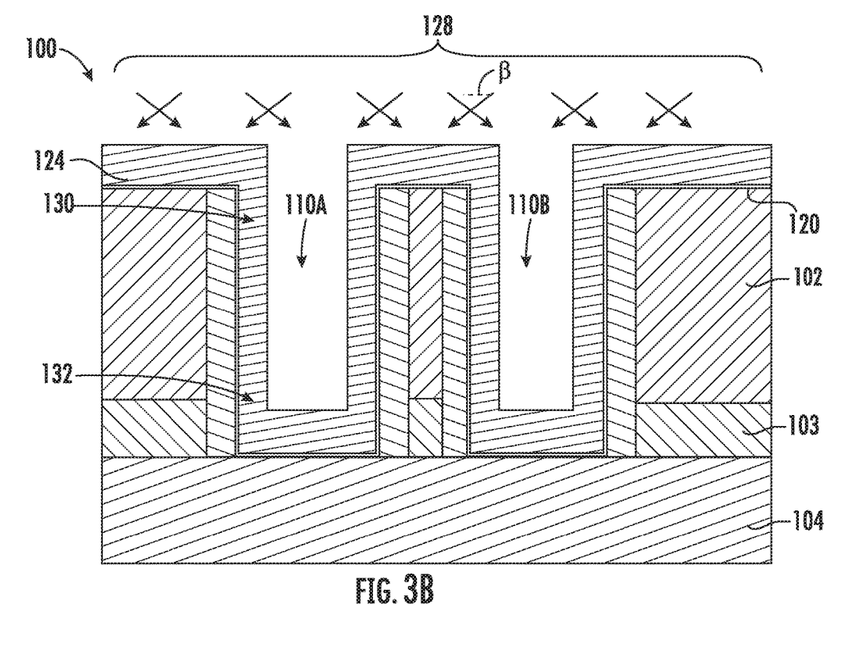
FIG. 3B depicts a side cross-sectional view of the deposition by angled ion implant to the long channel of the device in accordance with embodiments of the present disclosure.

As shown in FIGS. 3A-B, deposited by angled ion implant is then performed, wherein the angled ion implant 128 impacts the device 100 at a non-perpendicular ion implant 128. In some embodiments angle β relative to the top surface 120 of the ILD 102. As such, the angled ion implant 128 may impart ions at approximately 25-30° incidence angle to the top surface 120 of the ILD 102. The implantation angle β may vary in other embodiments by +/−15°.

In exemplary embodiments, the deposition by angled ion implant 128 impacts the first WF metal 124 along just an upper section 130 of each of the trenches 110A-B of the short channel depicted in FIG. 3A, without impacting the first WF metal 124 along a lower section 132 of each of the trenches 110A-B. As a result, a thickness of the first WF metal 124 over each of the trenches 110A-B may be increased by the angled ion implant deposition, to the point a capping layer 135 is formed across each of the trenches 110A-B. The capping layer 135 substantially pinches off or closes each of the trenches 110A-B, resulting in an enclosed or buried void 140 within each of the trenches 110A-B of the short channel. In one non-limiting embodiment, a TiN thickness of greater than 5.3 nm will cause pinch off at the top of the trenches 110A-B when the trenches 110A-B are approximately 20 nm wide. As demonstrated in FIG. 3B, the trenches 110A-B of the long channel are wide enough to prevent the first WF metal 124 from pinching and forming a capping layer across the trenches 110A-B as a result of deposition by angled ion implant 128. As the metal deposition of capping layer 135 is the same material as the first WF metal 124 (TiN p-type WF metal), there is no device impact on the long channel. In other embodiments, the capping layer 135 may be a different material than the first WF metal 124. The work function of the first WF metal 124 may be negatively affected.

Figure 4A:
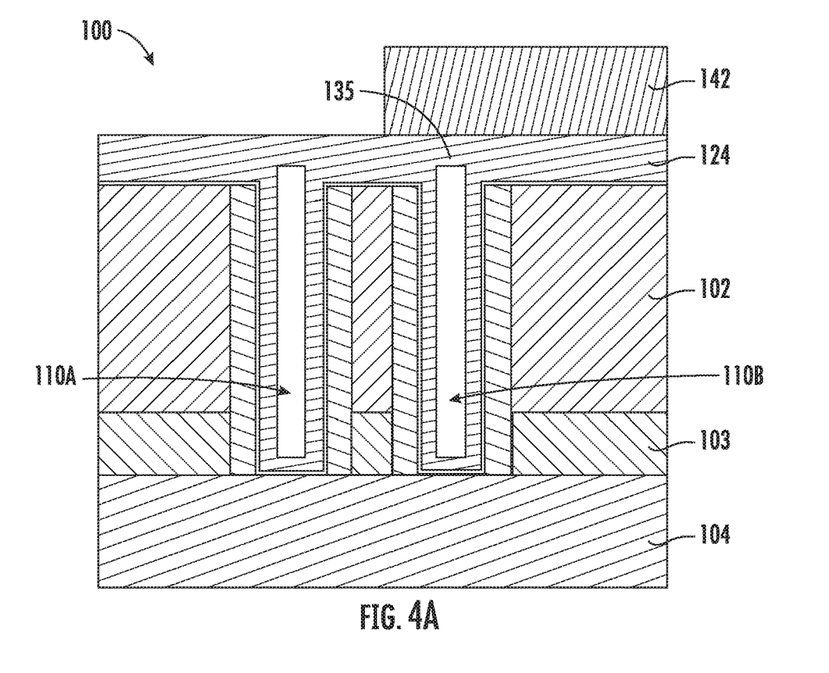
FIG. 4A depicts a side cross-sectional view of a blocking layer formed over the short channel of the device in accordance with embodiments of the present disclosure.
Figure 4B:
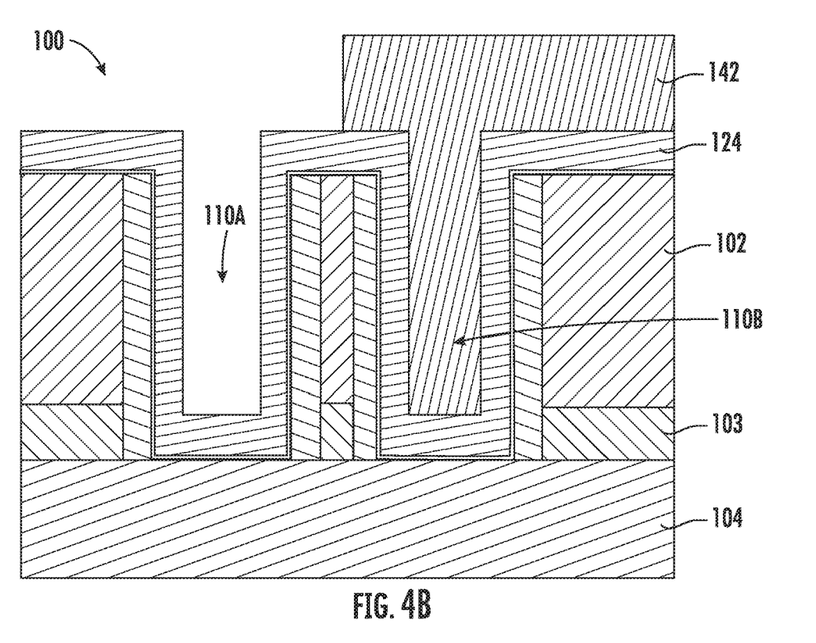
FIG. 4B depicts a side cross-sectional view of the blocking layer formed over the long channel of the device in accordance with embodiments of the present disclosure.

As shown in FIGS. 4A-B, a blocking layer 142 may be provided over just the second trench 110B following formation of the first WF metal 124 and deposition of the capping layer 135. The first trench 110A may remain uncovered by the blocking layer 142. In some embodiments, the blocking layer 142 is initially deposited over the capping layer 135 of the first WF metal 124, and then removed over the first trench 110A. For example, the blocking layer 142 may be an organic optical planarization (OPL) layer deposited over the first WF metal 124 and then patterned using conventional lithography. In one embodiment, the OPL layer is a hardmask layer on top of photo resist exposed to an intended pattern of radiation and then, using a resist developer to develop exposed portions of the photoresist, openings are selectively formed in the photoresist layer exposing portions of the functional gate structure, including the first WF metal 124, for subsequent removal.

Figure 5A:
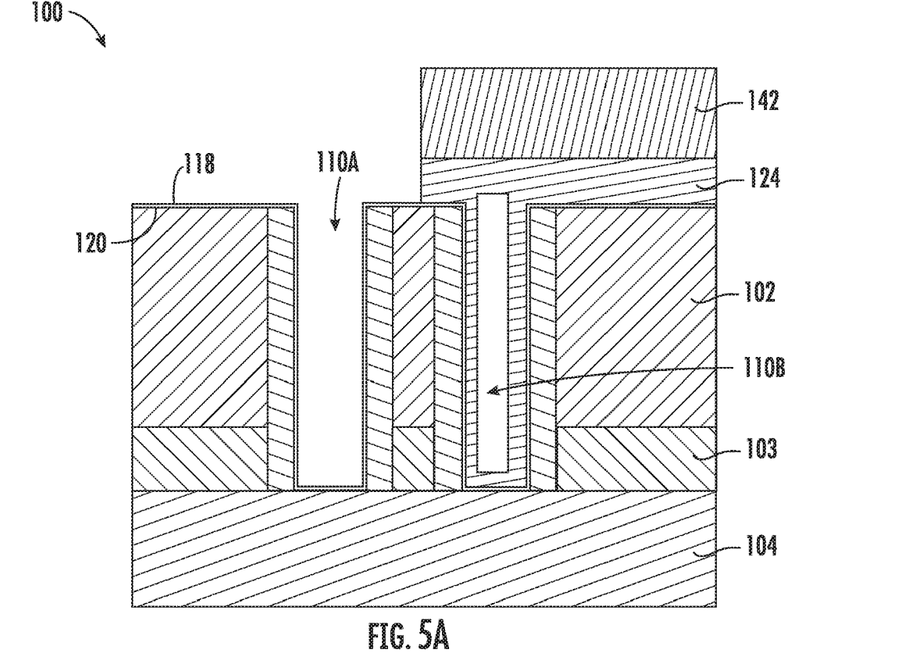
FIG. 5A depicts a side cross-sectional view of the short channel of the device with the first work function metal removed from one of the set of trenches in accordance with embodiments of the present disclosure.
Figure 5B:
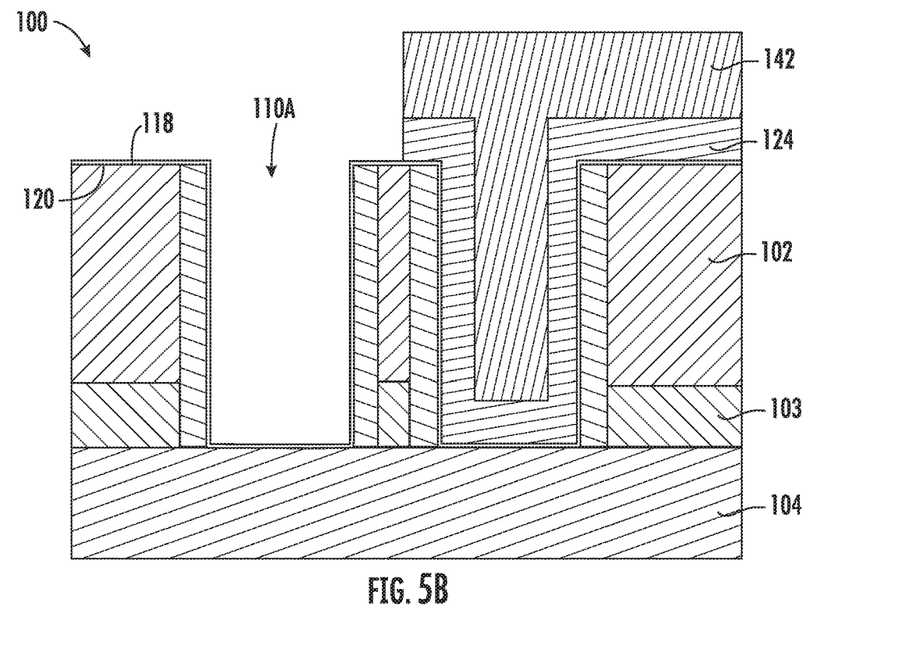
FIG. 5B depicts a side cross-sectional view of the long channel of the device with the first work function metal removed from one of the set of trenches in accordance with embodiments of the present disclosure.

With the blocking layer 142 in place, the first WF metal 124 may be removed from the first trench 110A, for example, as shown in FIGS. 5A-B. The first WF metal 124 may be removed selective to the gate dielectric 118 within the first trench 110A and above the top surface 120 of the ILD 102.

Figure 6A:
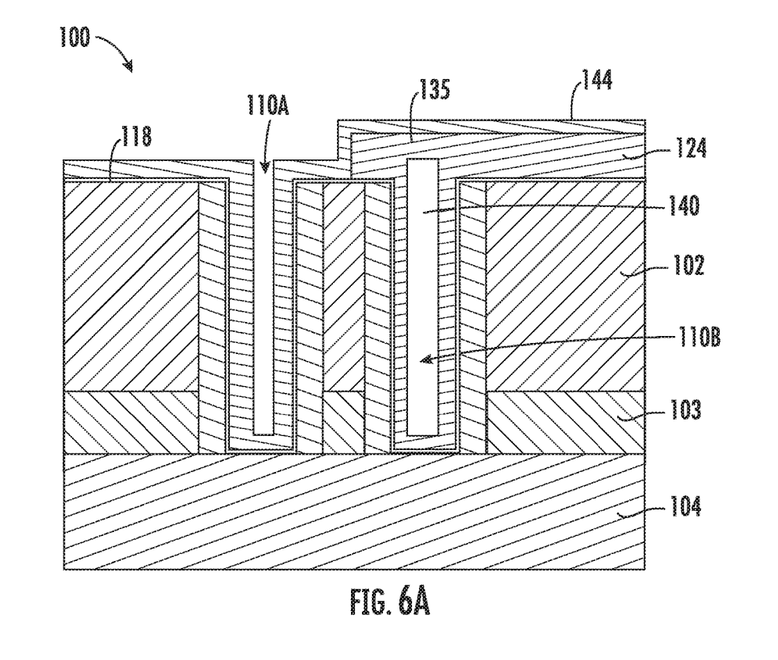
FIG. 6A depicts a side cross-sectional view of a second work function metal formed over the short channel of the device in accordance with embodiments of the present disclosure.
Figure 6B:
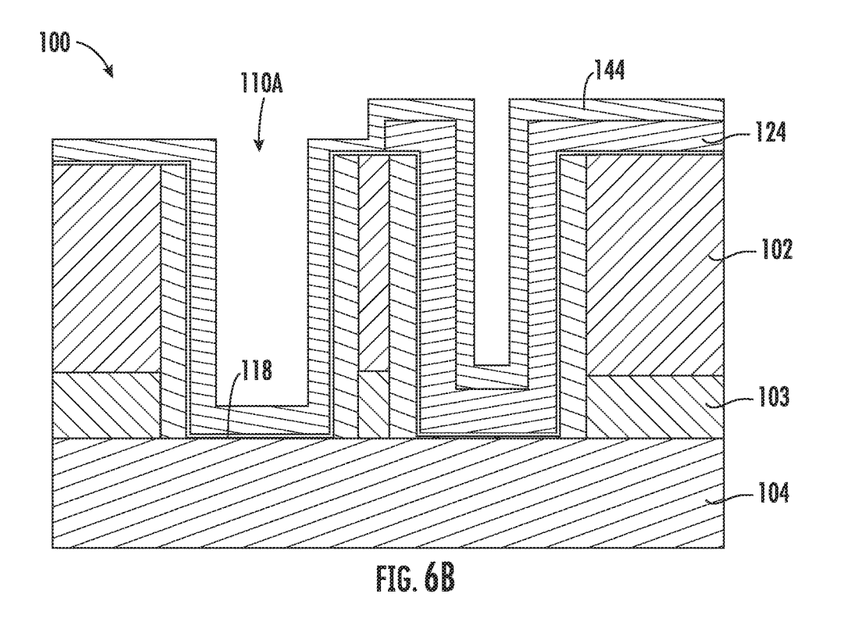
FIG. 6B depicts a side cross-sectional view of the second work function metal formed over the long channel of the device in accordance with embodiments of the present disclosure.

Next, as shown in FIGS. 6A-B, a second WF metal 144 is formed over the stack of layers 102 and 103, including conformally within the first trench 110A. In exemplary embodiments, the second WF metal 144 is deposited directly atop the gate dielectric 118 in the first trench 110A. In the short channel of FIG. 6A, the second WF metal 144 is formed directly atop the first WF metal 124 proximate the second trench 110B. Said another way, the second WF metal 144 extends over the capping layer 135 and the buried void 140 of the second trench 110B. In the long channel of FIG. 6B, the second WF metal 144 is formed directly atop the first WF metal 124 within the second trench 110B. In non-limiting embodiments, the second WF metal 144 may be an n-type WF metal, such as TiN/TiAlC/TiN.

Figure 7A:
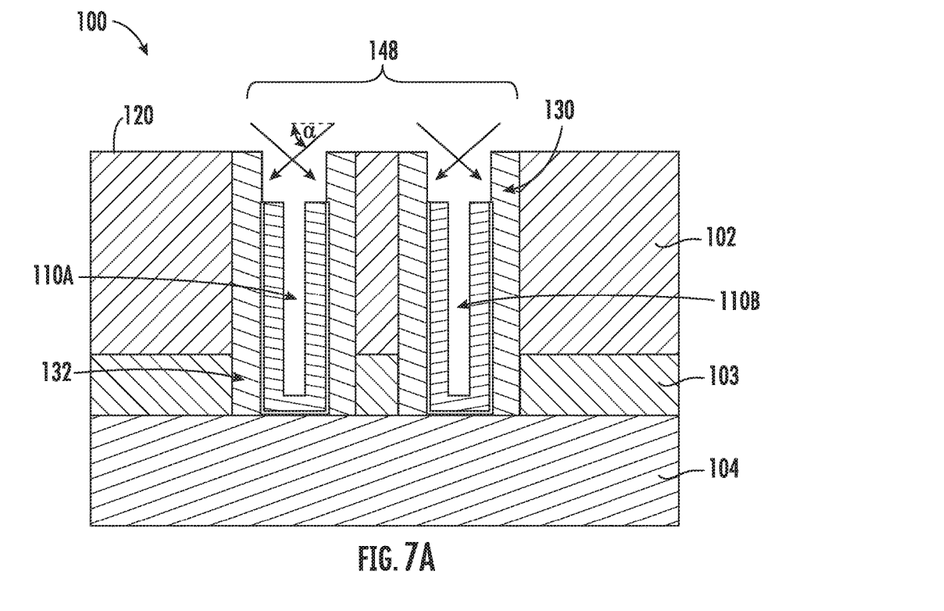
FIG. 7A depicts a side cross-sectional view of an angled ion etch to the short channel trenches of the device in accordance with embodiments of the present disclosure.
Figure 7B:
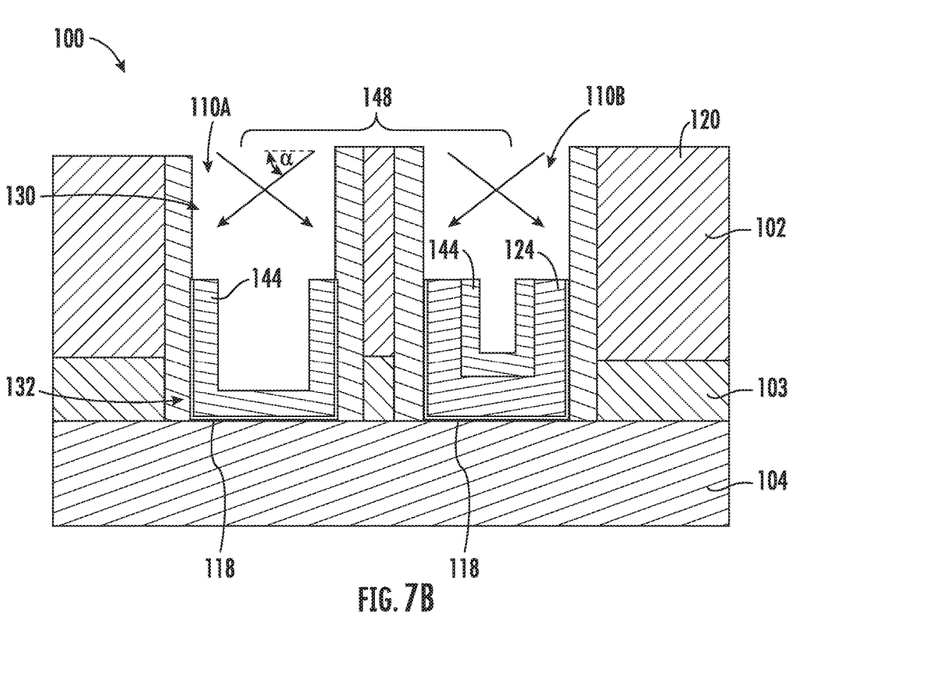
FIG. 7B depicts a side cross-sectional view of the angled ion etch to the long channel trenches of the device in accordance with embodiments of the present disclosure.

As shown in FIGS. 7A-B, the device 100 may then be subjected to an angled ion etch 148, such a reactive ion etch (RIE), performed at a non-perpendicular angle α relative to the top surface 120 of the ILD 102. In some embodiments, the RIE angle α is greater than approximately 26.5°. As shown, the angled ion etch 148 may remove the first WF metal 124, the second WF metal 144, and the gate dielectric 118 from the top surface 120 of the ILD 102. Because the angled ion etch 148 impacts the trenches 110A-B at non-perpendicular angle α, just the upper sections 130 of each of the 110A-B are affected. The lower sections 132 of each of trenches 110A-B remain substantially unetched due to the geometry of the trenches 110A-B and the angle of the angled ion etch 148. In exemplary embodiments, the angled ion etch 148 recesses the gate dielectric 118 and the second WF metal 144 within the first trench 110A, and recesses the gate dielectric 118 and the first WF metal 124 within the second trench 110B. As shown, the angled ion etch 148 may remove all material within the trenches 110A-B selective to the gate spacers 114. As further shown, because the trenches 110A-B of the long channel in FIG. 7B are wider than the trenches of the short channel in FIG. 7A, the second WF metal 144, the first WF metal 124, and the gate dielectric 118 may be recessed deeper for the long channel.

Figure 8A:
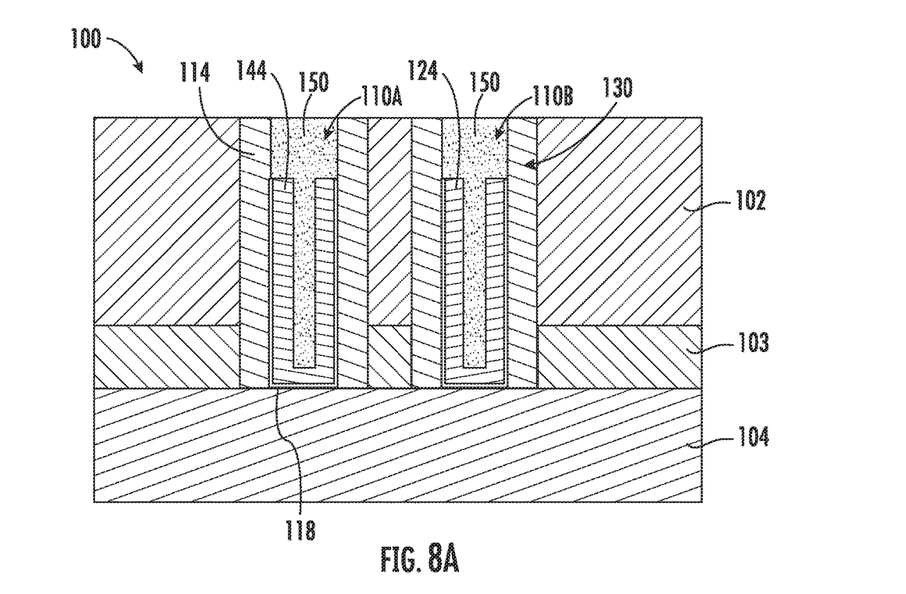
FIG. 8A depicts a side cross-sectional view of a gate metal formed in the short channel trenches of the device in accordance with embodiments of the present disclosure.
Figure 8B:
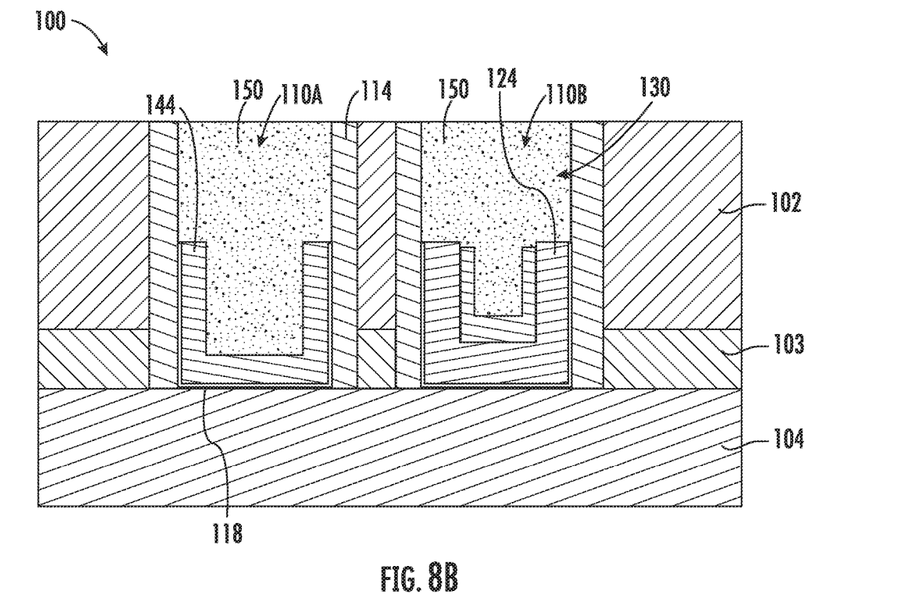
FIG. 8B depicts a side cross-sectional view of the gate metal formed in the long channel trenches of the device in accordance with embodiments of the present disclosure.

FIGS. 8A-B, show deposition and planarization of a conductive material or gate metal 150. The gate metal 150 may include, for example, Al, W, Cu, Pt, Ag, Au, Ru, Ir, Rh and Re, alloys of conductive metals, e.g., Al—Cu, silicides of a conductive metal, e.g., W silicide, and Pt silicide, and combinations thereof. The layer of the gate metal 150 can be formed utilizing a conventional deposition process such as, for example, atomic layer deposition (ALD), CVD, metalorganic chemical vapor deposition (MOCVD), molecular beam epitaxy (MBE), PVD, plating, evaporation, ion beam deposition, electron beam deposition, laser assisted deposition, and chemical solution deposition. As shown, the gate metal 150 is sandwiched by the second WF metal 144 within the first trench 110A, and sandwiched by the first WF metal 124 within the second trench 110B. As further shown, the gate metal 150 is in direct contact with the gate spacers 114 along the upper section 130 of each of the trenches 110A-B.

Figure 9A:
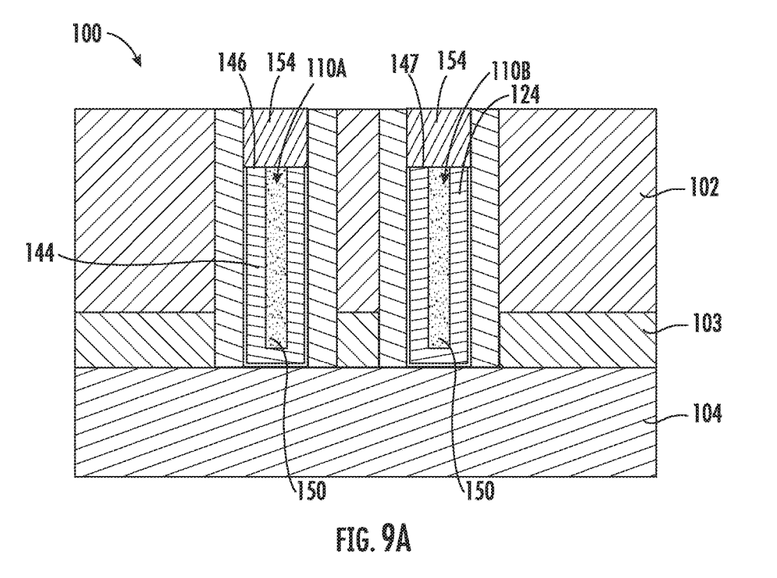
FIG. 9A depicts a side cross-sectional view of trench caps formed in the short channel trenches of the device in accordance with embodiments of the present disclosure.
Figure 9B:
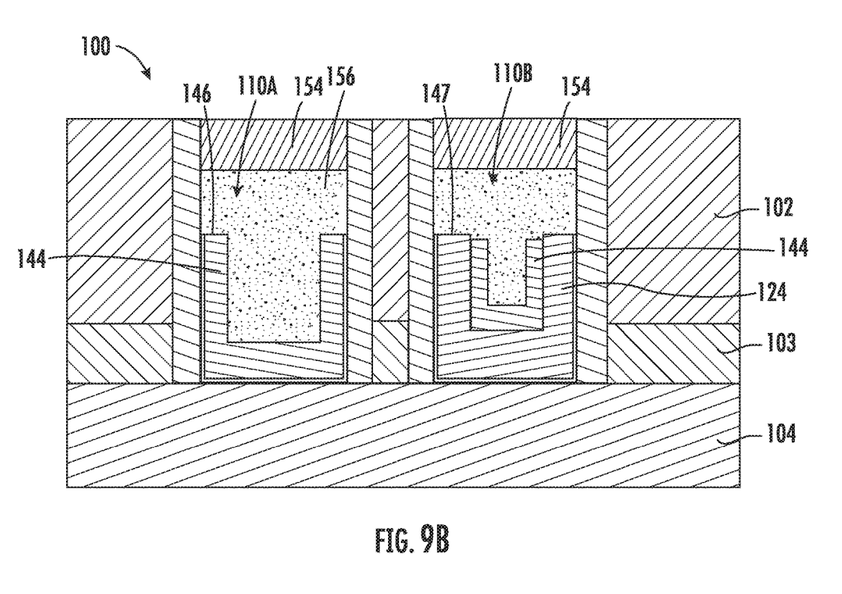
FIG. 9B depicts a side cross-sectional view of the trench caps formed in the long channel trenches of the device in accordance with embodiments of the present disclosure.

As shown in FIGS. 9A-B, the gate metal 150 may then be chamfered or recessed within the trenches 110A-B, for example, to a top surface 146 of the second WF metal 144 and the gate dielectric 118 within the first trench 110A, and to a top surface 147 of the first WF metal 124 and the gate dielectric 118 within the second trench 110B. A portion of the gate metal 150 remains within the trenches 110A-B, for example, within the second WF metal 144 of the first trench 110A, and within the first WF metal 124 of the second trench 110B of the short channel of FIG. 9A.

One or more trench caps 154 may then be formed within each of the trenches 110A-B, including over the gate dielectric 118 and the second WF metal 144 within the first trench 110A, and over the gate dielectric 118 and the first WF metal 124 within the second trench 110B. In some embodiments, the trench caps 154 may be formed by recessing with etch the gate metal 150, and then depositing SiN followed by CMP. As understood to those skilled in the art, CMP involves contacting a material layer to be polished with a rotating polishing pad. An abrasive slurry including an abrasive suspended in an aqueous solution, possibly also containing chemical constituents to achieve selectively, is disposed between the polishing pad and the material layer to be polished. The material layer to be polished is then polished away with the polish pad and slurry to achieve an intended removal.

Figure 10A:
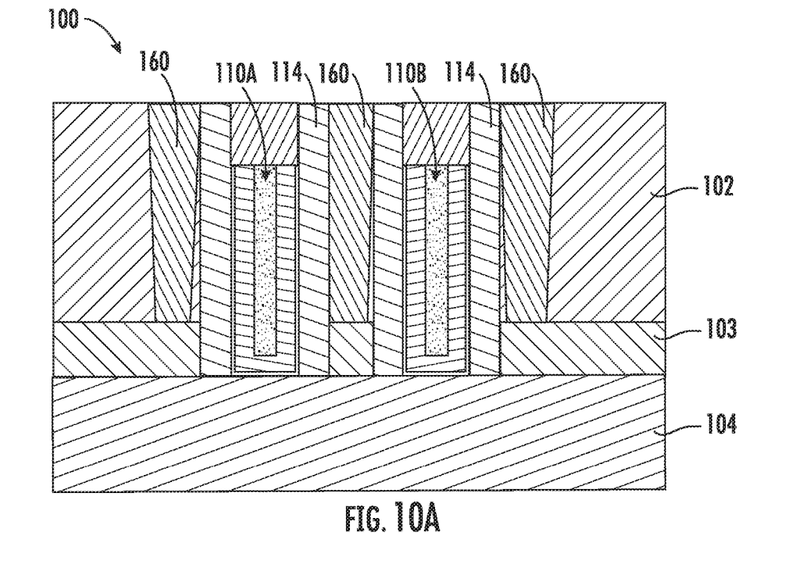
FIG. 10A depicts a side cross-sectional view of a set of contacts formed in the short channel of the device in accordance with embodiments of the present disclosure.
Figure 10B:
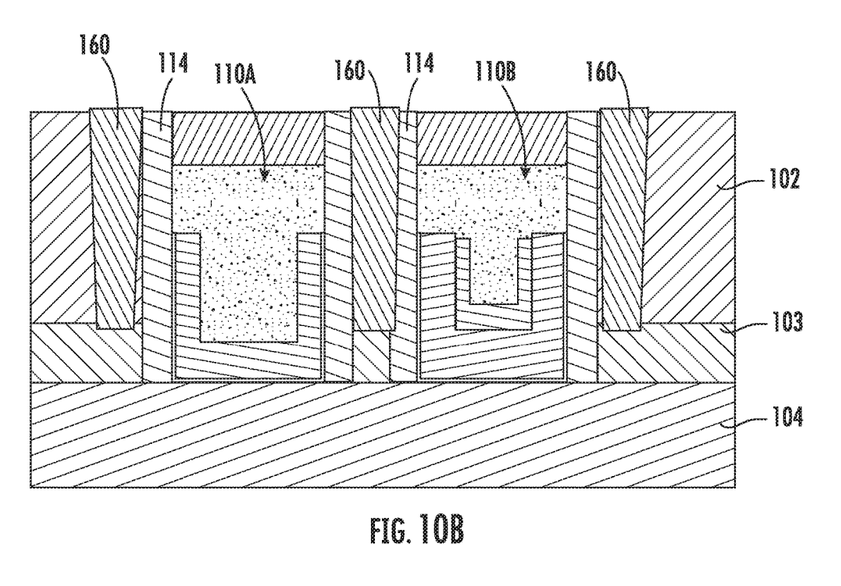
FIG. 10B depicts a side cross-sectional view of the set of contacts formed in the long channel of the device in accordance with embodiments of the present disclosure.

As shown in FIGS. 10A-B, a plurality of contacts 160 may then be formed within the ILD 102, adjacent each of the gate spacers 114. The contacts 160 may be source/drain (S/D) contacts formed adjacent each of the trenches 110A-B.

In various embodiments, design tools can be provided and configured to create the datasets used to pattern the semiconductor layers as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

In view of the foregoing, at least the following advantages are achieved by the embodiments disclosed herein. A first advantage is achieved by clogging the short channel trenches using the capping layer deposited via angled ion implant. Because there is no OPL coating inside short channel, less OPL RIE damage occurs on the long channel during the OPL removal on the long channel. In other words, if the OPL is filled on the short channel, RIE to remove the OPL takes longer on the short channel than on the long channel, because the short channel has smaller spacing causes a RIE loading effect. Therefore, the long channel will receive additional ME damages directly on the WF metal during removal of the OPL on the short channel. The capping layer therefore reduces impact on the long channel, such as Vt shift, Tox change, reliability degradation. A second advantage is achieved by not depositing the second work function metal on the short channel PFET, thus providing more physical space to fill the gate with the gate metal. Gate metal resistance may be reduced as a result, benefiting AC device performance. A third advantage results from the directional RIE used for work function metal chamfering because the RIE is performed minus an additional lithography process.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

The invention claimed is:

1. A method of forming a device, comprising:
forming a set of trenches in a stack of layers positioned atop a substrate;
forming a gate dielectric within the set of trenches;
forming a first work function (WF) metal atop the gate dielectric within the set of trenches;
forming a capping layer over the first WF metal using an angled ion implant deposition, the capping layer extending across the set of trenches;
removing the first WF metal from just a first trench of the set of trenches;
forming a second WF metal over the stack of layers, wherein the second WF metal is formed atop the gate dielectric within the first trench;
performing an angled ion etch to the set of trenches, wherein the angled ion etch recesses the gate dielectric and the second WF metal within the first trench of the set of trenches, and recesses the gate dielectric and the first WF metal within a second trench of the set of trenches; and
forming a gate metal within the set of trenches.

2. The method of claim 1, further comprising:
recessing the gate metal within the set of trenches;
forming a trench cap within the set of trenches; and
forming a plurality of contacts within the stack of layers, adjacent the set of trenches.

3. The method of claim 2, wherein forming the trench cap within the set of trenches comprises forming the trench cap over the gate dielectric and the second WF metal within the first trench of the set of trenches, and forming the capping layer over the gate dielectric and the first WF metal within the second trench of the set of trenches.

4. The method of claim 1, wherein the angled ion implant deposition forms a buried void, beneath the capping layer, within the set of trenches.

5. The method of claim 1, wherein the angled ion implant deposition impacts the first WF metal along an upper section of the set of trenches, and wherein the angled ion implant deposition does not impact the first WF metal along a lower section of the set of trenches.

6. The method of claim 1, wherein the angled ion implant deposition and the angled ion etch are performed at a non-perpendicular angle relative to a top surface of the stack of layers.

7. The method of claim 1, further comprising forming a blocking layer over the second trench of the set of trenches after the capping layer is formed over the first WF metal, wherein the first trench of the set of trenches is not covered by the blocking layer.

8. The method of claim 1, further comprising removing the first WF metal from the first trench of the set of trenches selective to the gate dielectric.

9. The method of claim 1, wherein the first WF metal is a p-type WF metal, and wherein the second WF metal is an n-type WF metal.

10. The method of claim 1, further comprising providing a gate spacer along the set of trenches, wherein the angled ion etch recesses the gate dielectric and the second WF within the first trench selective to the gate spacer, and recesses the gate dielectric and the first WF metal within the second trench selective to the gate spacer.

11. A method of forming replacement metal gates, comprising:
forming a set of trenches in an interlayer dielectric selective to a top surface of a substrate;
forming a gate dielectric within the set of trenches;
forming a first work function (WF) metal atop the gate dielectric within the set of trenches;
forming a capping layer over the first WF metal using an angled ion implant deposition, wherein the capping layer extends across the set of trenches, and wherein the angled ion implant deposition is performed at a non-perpendicular angle relative to a top surface of the interlayer dielectric;
removing the first WF metal from just a first trench of the set of trenches;
forming a second WF metal over the interlayer dielectric, wherein the second WF metal is formed atop the gate dielectric within the first trench;
performing an angled ion etch to the set of trenches, wherein the angled ion etch recesses the gate dielectric and the second WF metal within the first trench of the set of trenches, and recesses the gate dielectric and the first WF metal within a second trench of the set of trenches; and
forming a gate metal within the set of trenches.

12. The method of claim 11, further comprising:
recessing the gate metal within the set of trenches;
forming a trench cap within the set of trenches, including over the gate dielectric and the second WF metal within the first trench of the set of trenches, and over the gate dielectric and the first WF metal within the second trench of the set of trenches; and
forming a plurality of contacts within the interlayer dielectric, adjacent the set of trenches.

13. The method of claim 11, wherein the angled ion implant deposition forms an enclosed void, beneath the capping layer, within the set of trenches.

14. The method of claim 11, wherein the angled ion etch is performed at a non-perpendicular angle relative to the top surface of the interlayer dielectric, wherein the angled ion implant deposition impacts the first WF metal along an upper section of the set of trenches, and wherein the angled ion implant deposition does not impact the first WF metal along a lower section of the set of trenches.

15. The method of claim 11, further comprising forming a blocking layer over the second trench of the set of trenches after the capping layer is formed over the first WF metal, wherein the first trench of the set of trenches is not covered by the blocking layer.

16. The method of claim 11, further comprising removing the first WF metal from the first trench of the set of trenches selective to the gate dielectric.

17. A method of forming replacement metal gates, comprising:
providing a device, the device comprising:
an interlayer dielectric atop a substrate;
a gate dielectric within a set of trenches formed in the interlayer dielectric;
a first work function (WF) metal atop the gate dielectric within the set of trenches;
forming a capping layer over the first WF metal using an angled ion implant deposition, wherein the capping layer extends across the set of trenches, and wherein the angled ion implant is delivered at a non-perpendicular angle relative to a top surface of the interlayer dielectric;

removing the first WF metal from just a first trench of the set of trenches;

forming a second WF metal over the interlayer dielectric, wherein the second WF metal is formed atop the gate dielectric within the first trench; and performing an angled ion etch to the set of trenches, wherein the angled ion etch is performed at a non-perpendicular angle relative to the top surface of the interlayer dielectric, and wherein the angled ion etch recesses the gate dielectric and the second WF metal within the first trench of the set of trenches, and recesses the gate dielectric and the first WF metal within a second trench of the set of trenches.

18. The method according to claim 17, further comprising:

recessing a gate metal formed within the set of trenches;

forming a trench cap within the set of trenches, including over the gate dielectric and the second WF metal within the first trench of the set of trenches, and over the gate dielectric and the first WF metal within the second trench of the set of trenches; and forming a plurality of contacts within the stack of layers, adjacent the set of trenches.

19. The method of claim 17, wherein the angled ion implant deposition forms an enclosed void, beneath the capping layer, within the set of trenches.

20. The method of claim 17, wherein the angled ion implant deposition impacts the first WF metal along an upper section of the set of trenches, and wherein the angled ion implant deposition does not impact the first WF metal along a lower section of the set of trenches.

* * * * *